United States Patent [19]
Ishikawa

[11] Patent Number: 5,521,870
[45] Date of Patent: May 28, 1996

[54] SEMICONDUCTOR MEMORY DEVICE HAVING A COINCIDENCE DETECTION CIRCUIT AND ITS TEST METHOD

[75] Inventor: Toru Ishikawa, Tokyo, Japan

[73] Assignee: NEC Corporation, Tokyo, Japan

[21] Appl. No.: 354,086

[22] Filed: Dec. 6, 1994

[30] Foreign Application Priority Data

Dec. 7, 1993 [JP] Japan .................................. 5-339859

[51] Int. Cl.⁶ .................................................. G11C 11/40
[52] U.S. Cl. ................ 365/189.07; 365/189.12; 365/230.03
[58] Field of Search ................. 365/230.03, 189.12, 365/189.07, 201, 219

[56] References Cited

U.S. PATENT DOCUMENTS 4,667,313  5/1987  Pinkham ........................... 365/189.12
5,371,714  12/1994  Matsuda .......................... 365/230.03

OTHER PUBLICATIONS

Nikkei Electronics, Apr. 6, 1987, No. 418, pp. 149–163.

*Primary Examiner*—A. Zarabian
*Attorney, Agent, or Firm*—Whitham, Curtis, Whitham & McGinn

[57] ABSTRACT

A semiconductor memory device includes a plurality of memory blocks, a write circuit for writing data into the memory blocks, a read circuit for reading data from the memory blocks, a plurality of serial registers, each of which is connected to the corresponding memory block to output serially a plurality of data read from the memory block, a plurality of switches, each of which is arranged between two adjacent ones of the serial registers to connect the serial registers in series, and a coincidence detection circuit for detecting a coincidence of data outputted from a final serial register arranged at a final end of the serial registers connected by the switches with data outputted from a serial register arranged immediately before the final serial register.

10 Claims, 8 Drawing Sheets

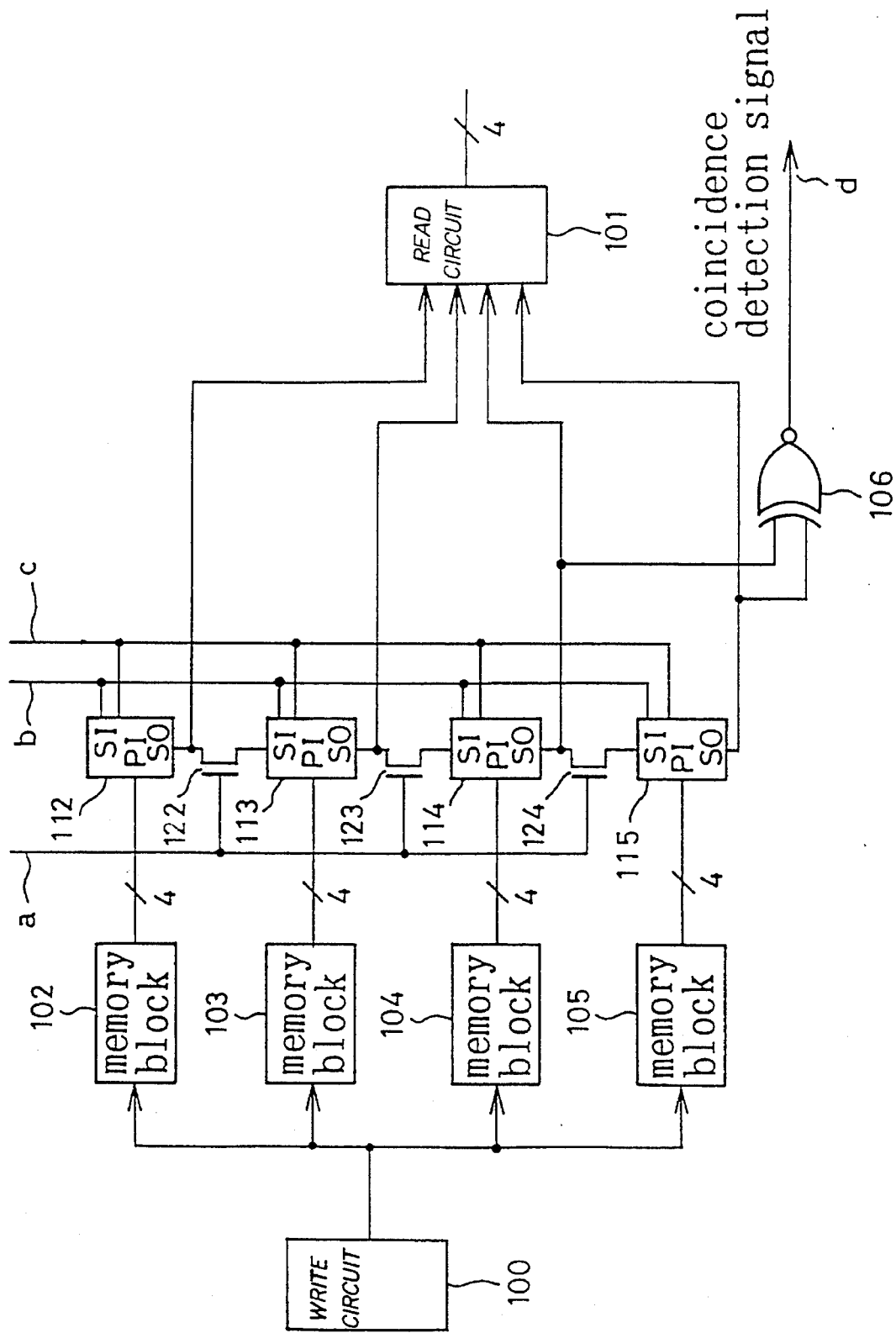

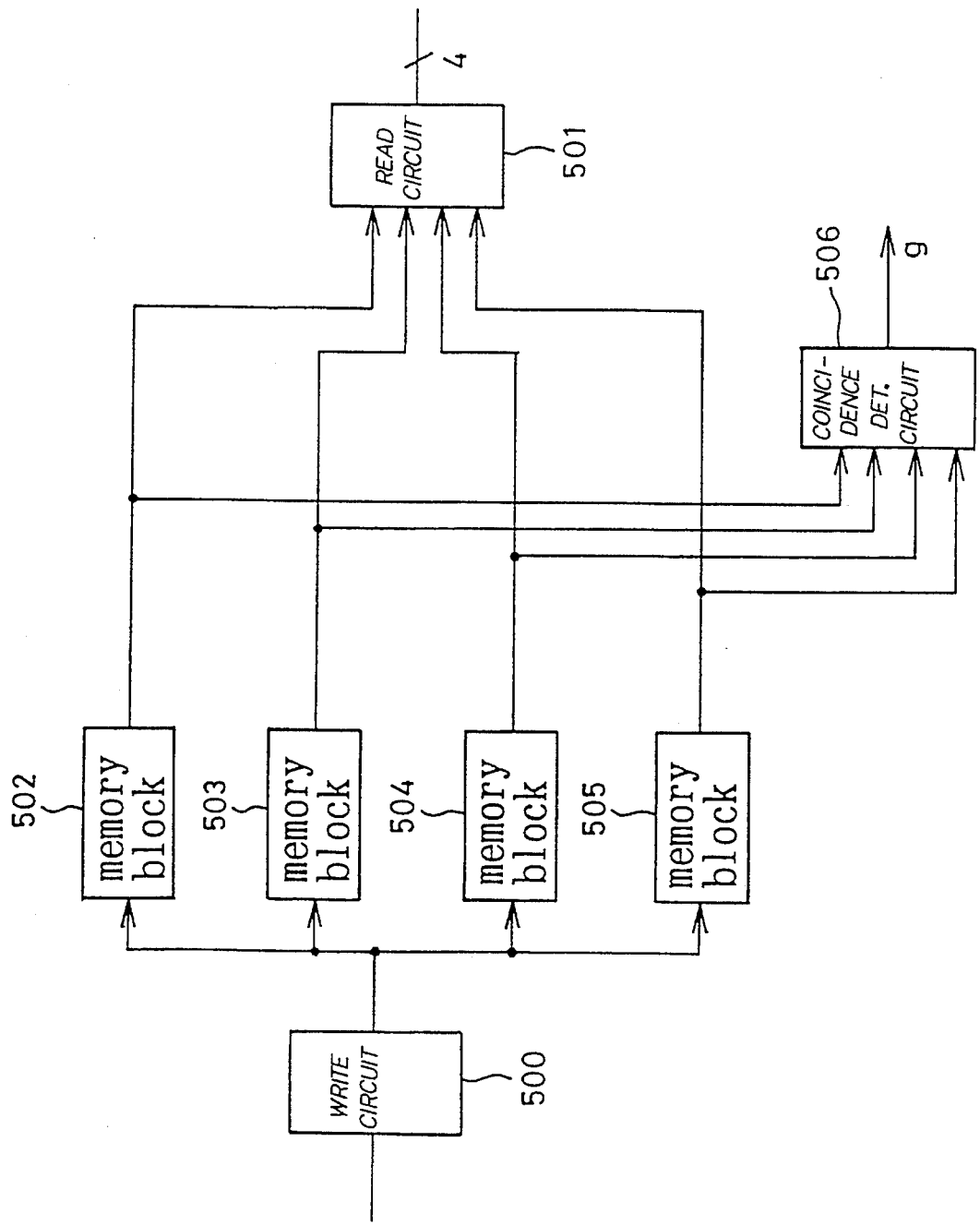

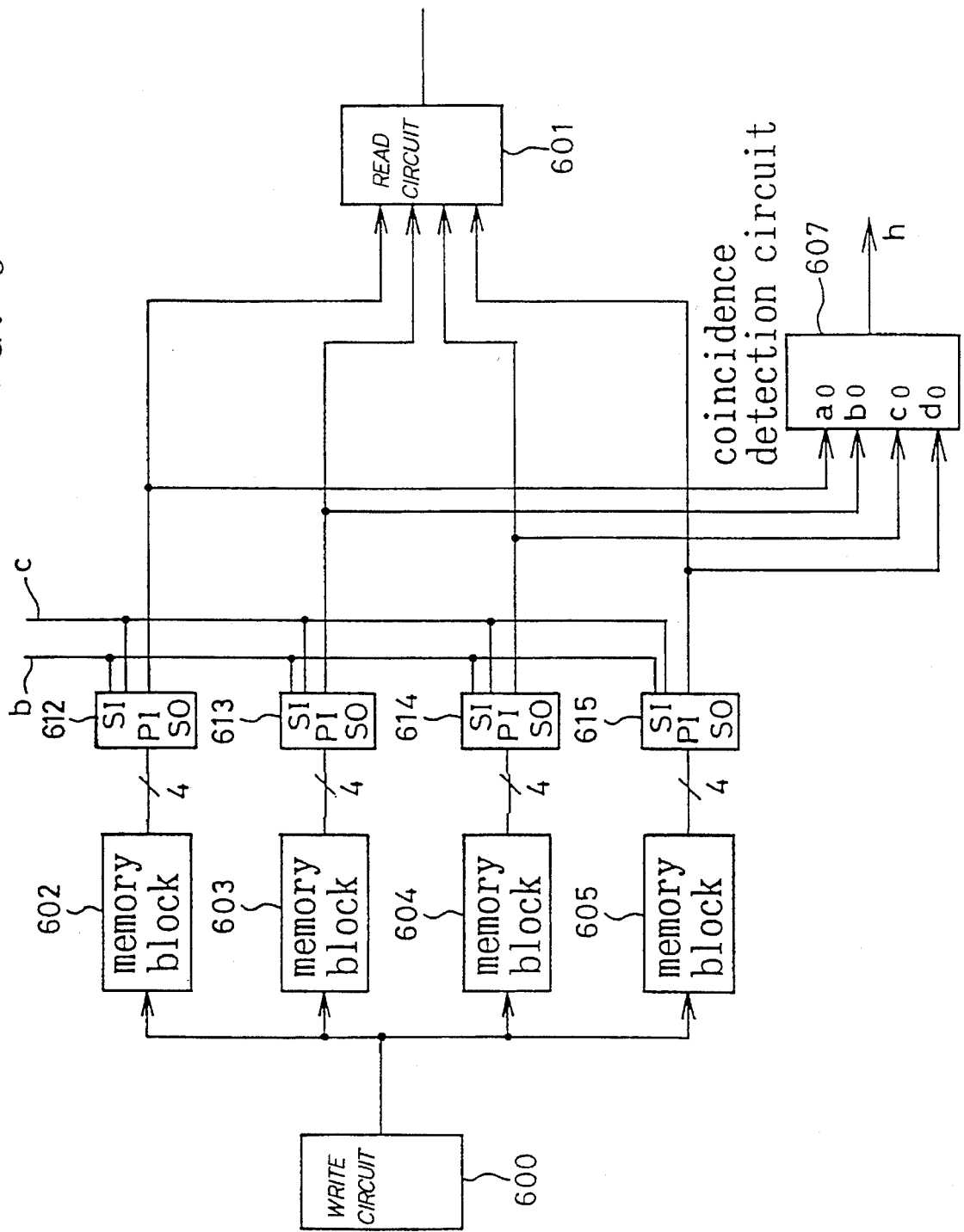

SEMICONDUCTOR MEMORY DEVICE HAVING A COINCIDENCE DETECTION CIRCUIT AND ITS TEST METHOD

BACKGROUND OF THE INVENTION

1. Field of the Invention

This invention relates to a semiconductor integrated circuit test system. More specifically this invention relates to a semiconductor memory test device and a test method of a semiconductor memory device.

2. Description of the Prior Art

Recently, with the increase in the number of bits of a semiconductor memory device, a semiconductor memory device with a data width of 16 or 32 bits has been developed. The number of pins installed in a memory tester for monitoring data bits of a semiconductor memory device need to be increased with the expansion of a data width of the semiconductor memory device, so that if the data width of a semiconductor memory should expand, for example, from 4 to 32 bits, the number of semiconductor memory devices which can simultaneously be tested on a memory tester may decrease down to ⅛ in the worst case due to the restriction of the total pin counts installed in the memory tester.

For solving the above-mentioned problem, a parallel test technique implemented in a memory chip is widely employed. For example, with a technique disclosed on pp. 149–163 of NIKKEI ELECTRONICS Apr. 6, 1987, No. 418, a memory is internally divided into four blocks such that in testing the memory, the same data is written into each block and "1" is outputted if all data read from the blocks coincide, while "0" is outputted if they do not coincide.

FIG. 5 illustrates a block diagram of a prior art example of a parallel test technique for testing a semiconductor memory. Referring to FIG. 5, the same data is written into the memory blocks 502 to 505 and bit data outputted from the memory blocks 502 to 505 are inputted to a coincidence detection circuit 506 to be checked whether they coincide with each other.

According to the above constitution, even with the data width of a semiconductor memory increasing to 16 bits, or further up to 32 bits, it is enough to monitor only one-bit output signal from a coincidence detection circuit 506 for detecting a coincidence of bit data from memory blocks, so that the number of memories which can simultaneously be tested on a memory tester may be increased without being restricted by pin counts for monitoring data in a memory tester.

Recently, such a memory corresponding to the increase in an access speed, is used in practice as that comprising serial registers which read a plurality of data from memory blocks in parallel and outputs the data through the serial registers from output terminals of the memory chip at a high speed. The above-mentioned parallel test may also be applied for testing such a special memory.

Referring to FIG. 6, a conventional technique for testing a memory comprising serial registers is now explained. As shown in FIG. 6, in case of 4-bit parallel test, data read from memory blocks 602, 603, 604 and 605 every four bits in parallel is fed to serial registers 612, 613, 614 and 615 respectively and thereafter by setting a control signal b to "H" level, and supplying a clock signal c, data is read from a serial output terminal of the serial registers and compared by a coincidence detection circuit 607 from which "1" is outputted if all data coincide while "0" is outputted if they do not coincide.

FIG. 7(A) illustrates a circuit structure of the coincidence detection circuit 607 in FIG. 6. Referring to FIG. 7(A), the coincidence detection circuit 607 is composed of three 2-input exclusive NOR (XNOR) circuits and an AND gate such that an output h is set to "1" only if four inputs a0, b0, c0 and d0 are of the same logical value. FIG. 7(B) illustrates a circuit structure of the 2-input XNOR circuit at a transistor level. Referring to FIG. 7(B), when both inputs 7a and 7b are at "H" or "L" level, an output 7c comes to "H" level.

The memory shown in FIG. 6 may be reconfigured so as to compare 16 bits data read out of the memory blocks, that is, 4 bits×4 (memory blocks), without going through the serial registers, however, in such a case, the circuit size of a coincidence detection circuit increases. Therefore, the constitution shown in FIG. 6 is generally used.

As described above, the conventional technique for testing a semiconductor memory suffers from the drawback that the circuit size of the coincidence detection circuit increases as the number of blocks to be divided increases and the number of wires employed for interconnecting memory blocks also increases for outputting a comparison result between memory blocks as one bit data indicating a status of coincidence or non-coincidence.

More specifically, as shown in FIG. 8, when the number of memory blocks and the number of serial registers increases from 4 (see FIG. 8(A) to FIG. 8(B)), the number of XNOR gates to be operated as coincidence detection circuits increases by 4 and resultingly the number of 3-input AND gates increases by 2 in order to obtain the logical product of the comparison results between blocks, as a result of which, the number of wires also increases.

SUMMARY OF THE INVENTION

In view of the above-mentioned drawbacks of the prior art technique, it is an object of the present invention to provide a semiconductor memory comprising a data comparison circuit being installed in a semiconductor memory with a large data width, and outputting a comparison result by narrowing the data width, which prevents the amount of circuit elements of the data comparison circuit from increasing due to increase of the data width.

It is also an object of the present invention to provide a method for testing a semiconductor memory comprising a data comparison circuit being installed in a semiconductor memory with a large data width, and outputting a comparison result by narrowing the data width, which prevents the amount of circuit elements of the data comparison circuit from increasing due to increase of the data width.

For accomplishing the above described object, the present invention provides a semiconductor memory device comprising a plurality of memory blocks, a write circuit unit for writing data into said memory blocks, a read circuit unit for reading data from said memory blocks, a plurality of serial registers, each of said serial registers being connected to the corresponding memory block to output serially a plurality of data read from the memory block, a plurality of switches, each of said switches being arranged between two adjacent ones of said serial registers to connect said serial registers in series, and a coincidence detection unit for detecting a coincidence of data outputted from a final serial register arranged at a final end of said serial registers connected by said switches with data outputted from a serial register arranged immediately before the final serial register.

The present invention also provides a semiconductor memory device comprising, a plurality of memory blocks (= n blocks), a write circuit unit for writing data into said memory blocks, a read circuit unit for reading data from said memory blocks, a plurality of serial registers (= n serial registers), each of said serial registers being connected to the corresponding memory block to output serially a plurality of data read from the memory block, a plurality of switches for connecting said n serial registers by every m serial registers (m is a divisor of n) in series, and a plurality of coincidence detection units, wherein each of said coincidence detection units is arranged to detect a coincidence of data outputted from a final serial register of the m serial registers connected by the switches with data outputted from a serial register arranged immediately before the final serial register.

In the semiconductor memory device of the present invention, the switches are preferably made up of N-channel transfer gates.

In the semiconductor memory device of the present invention, the coincidence detection unit is preferably made up of a 2-input exclusive NOR circuit.

In the semiconductor memory device of the present invention, the serial register is preferably made up of a plurality of D-type flip flops, and a plurality of transfer gates, each of said transfer gates being arranged between two adjacent D-type flip flops to connect the D-type flip flops in series in a test mode.

The present invention in an another aspect provides a method for testing a semiconductor memory wherein said semiconductor memory device comprises a plurality of memory blocks, a write circuit unit for writing data into said memory blocks, a read circuit unit for reading data from said memory blocks, a plurality of serial registers (= n serial registers), each of said serial registers being connected to the corresponding memory block to output serially data read from the memory block, the method comprising; writing same data in said memory blocks at a test, inputting data read from said memory blocks to said serial registers, connecting said serial registers in series, and monitoring a result of a coincidence detection of data outputted from a final serial register arranged at a final end of said serial registers with a data outputted from a serial register arranged immediately before the final serial register.

The present invention further provides a method for testing a semiconductor memory wherein said semiconductor memory device comprises a plurality of memory blocks, a write circuit unit for writing data into said memory blocks, a read circuit unit for reading data from said memory blocks, a plurality of serial registers, each of said serial registers being connected to the corresponding memory block to output serially data read from the memory block, the method comprising, writing same data in said memory blocks at a test, inputting data read from said memory blocks to said serial registers, dividing said n serial registers into a plurality of groups, each group comprising m serial registers (m is a divisor of n) to connect said m serial registers in every group, and monitoring by every group of said groups a result of a coincidence detection of data outputted from a final serial register arranged at a final end of said m serial registers with data outputted from a serial register arranged immediately before the final serial register.

According to the semiconductor memory device of the present invention, as explained in detail below, even if the data width of a memory increases and the number of memory blocks and that of the serial registers increase, for example, from 4 to 8, only four transfer gates are to be added to a coincidence detection, so that the present invention has an advantage that the growth of the circuit size due to increase of data width is significantly suppressed. The present invention also prevents the number of wires from increasing due to the increase of the data width of a memory.

Further, with the semiconductor memory of the present invention, the problem of the increase in clock cycles required for detecting a coincidence due to the increase of the number of serial registers is being solved by dividing serial registers into plural groups and providing plural coincidence detection circuits, each of which is so arranged as to correspond to a group of serial registers. The present invention has an advantage that it significantly prevents the clock cycles required for detecting a coincidence from increasing due to increase of the data width of a memory to realize a high-speed memory testing.

The semiconductor memory test method of the present invention prevents the circuit size of a coincidence detection circuit from increasing, avoids the decrease of the number of memories which can simultaneously be tested on a memory tester to realize an efficient memory testing.

Further, the semiconductor memory test method of the present invention significantly prevents the number of clocks required for coincidence detection from increasing even with the data width of a semiconductor memory being increased to realize a high-speed testing of a semiconductor memory having a large data width on a memory tester.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 1 is a block diagram showing the structure of the first embodiment of the present invention.

FIGS. 2(A) and 2(B) are illustrations showing the comparison between four-block and eight-block circuit structures in the embodiment of the present invention, in which FIG. 2(A) is a block diagram of four memory blocks and FIG. 2(B) is a block diagram of eight memory blocks.

FIG. 5 is a block diagram showing the structure of a prior art example.

FIG. 6 is a block diagram showing the structure of a conventional memory comprising serial registers.

FIGS. 7(A) and 7(B) are illustrations showing the coincidence detection circuit of a prior art example, in which FIG. 7(A) is a logic circuit diagram of the coincidence detection circuit and FIG. 7(B) shows a case of using four memory blocks and FIG. 8(B) is a circuit diagram of a 2-input XNOR circuit at the transistor level.

FIGS. 8(A) and 8(B) are illustrations showing the comparison between 4 and 8 blocks of a prior art example, in which FIG. 8(A) is a block diagram of a four memory block structure and FIG. 8(B) is a block diagram of an eight memory-block structure.

DESCRIPTION OF THE PREFERRED EMBODIMENTS

Figure 2A:
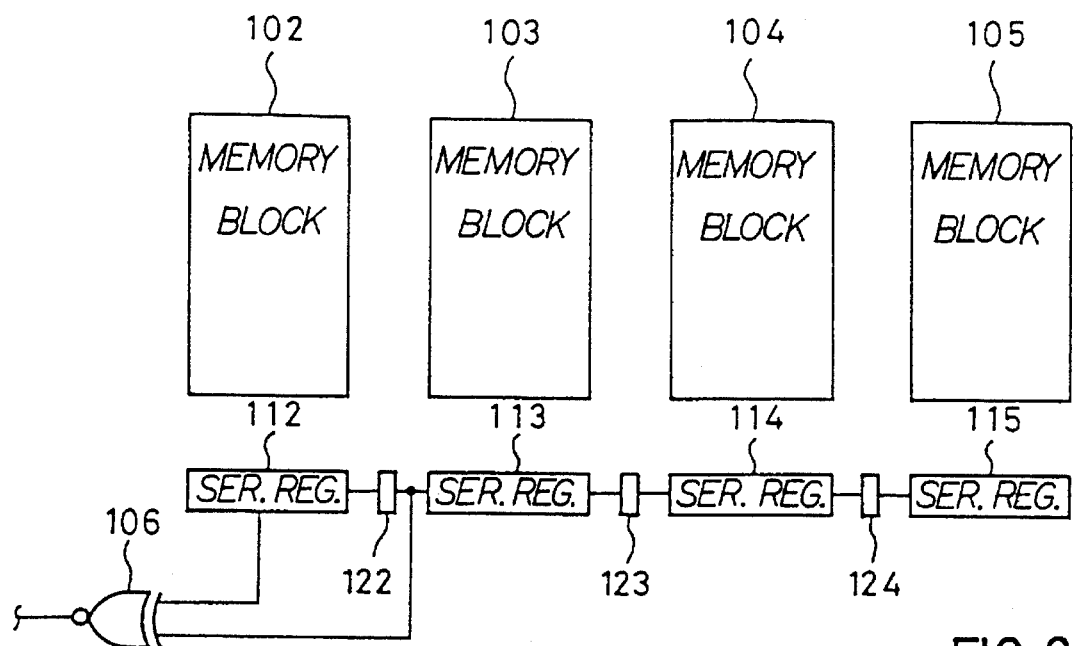

Referring to the drawings, preferred embodiments of the present invention will be described in detail.

As shown in FIG. 1, the semiconductor memory of the present embodiment comprises a write circuit 100, four separate memory blocks 102 to 105, serial registers 112 to 115 each of which is connected to the output (4 bits) of a corresponding memory block, transfer gates 122 to 124, each of which is arranged between neighboring two serial registers, 2-input coincidence detection citcuit 106 and read circuit 101.

The same data is written into the four memory blocks 102 to 105 by the write circuit 100. Four-bits data outputted from each of the four memory blocks 102 to 105 is inputted to four-bits parallel input terminal PI of the corresponding serial registers 112 to 115 respectively.

Then, a serial register connection signal (a) is set to "H" level to turn on the transfer gates 122, 123 and 124. As a result thereof, a serial output terminal SO of the serial register 112 is electrically connected to a serial input terminal SI of the next serial register 113 through the transfer gate 122 (the same is applied to other serial registers) so that the serial registers 112, 113, 114 and 115 form one continuous serial register as a whole.

When a serial signal (b) is set to "H" level and a clock signal (c) is supplied, the data in the serial register 112 is sequentially shifted and transferred to the serial register 113. Similarly, the data in the serial register 113 is transferred to the serial register 114 and the data in the serial register 114 is transferred to the serial register 115 sequentially.

The output of the serial register 114 is composed with that of the final stage serial register 115 by the 2-input XNOR circuit 106. The data in the serial register 112 and that in the serial register 113 are also sequentially transferred to the serial register 114 and the serial register 115. In all, the data in the serial register 115 is compared with that in the serial register 114 in the first four clock cycles, the data in the serial registers 114 is compared with that in the serial resister 113 in the second four clock cycles, and the data in the serial register 113 is compared with that in the serial register 112 in the third four clock cycles.

Figure 3:
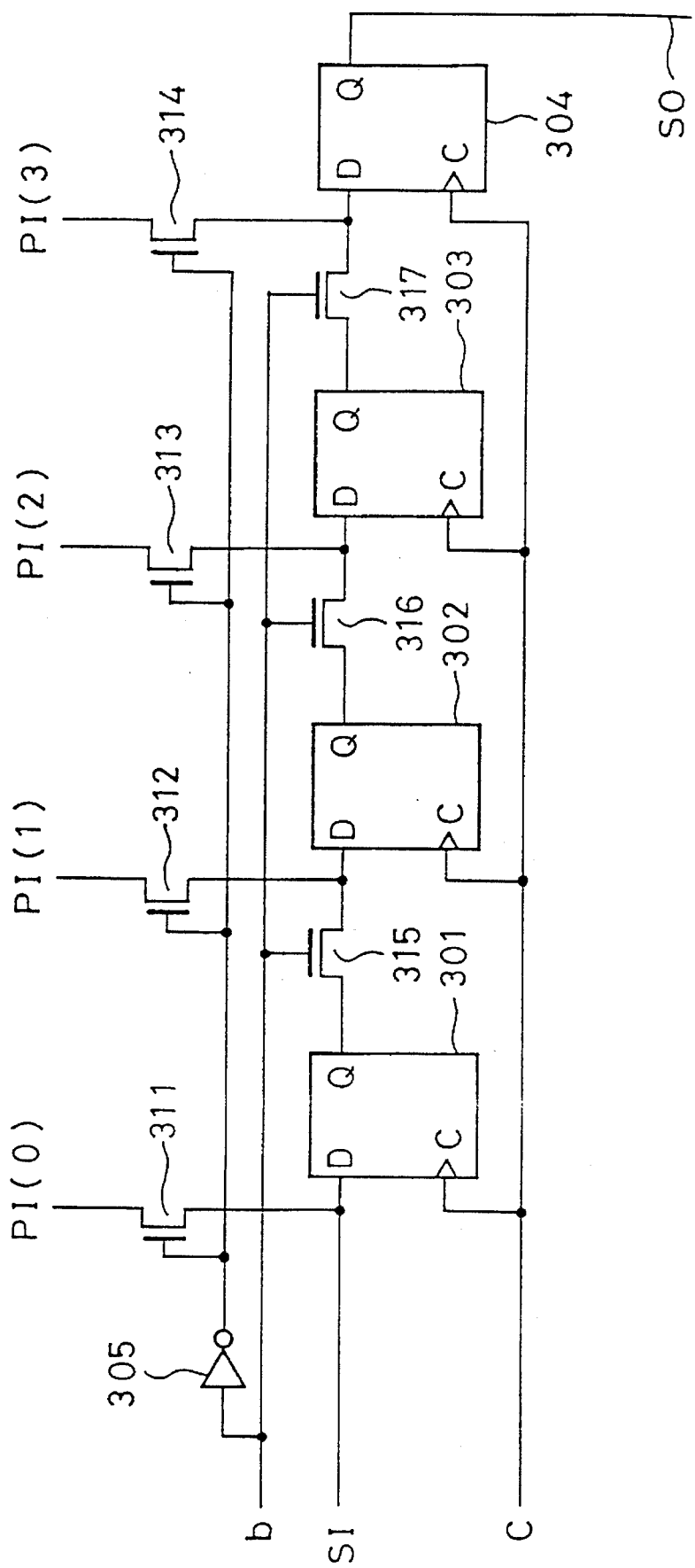
FIG. 3 is a circuit diagram of the serial register of the present invention.

FIG. 3 shows the circuit structure of a 4-bit serial register employed in the present embodiment. Referring to FIG. 3, the 4-bit serial register is made up of four D-type flip flops 301 to 304 and N-channel MOS transfer gates 315 to 317 are provided between the output and input terminals of two adjacent D-type flip flops respectively. The 4-bits output data at each memory block are fed to parallel input terminals PI(0) to PI(3) and connected to the data input terminals of the D-type flip-flops 301 to 304 through the N-channel MOS transfer gates 311 to 314 respectively.

Referring to FIG. 3, if the serial signal (b) is at "L" level, the gate potentials of the transfer gates 311 to 314 are set to "H" level through an inverter 305 to turn on these transfer gates, so that the 4-bits data being read from the corresponding memory block and inputted to the 4-bits parallel input terminals PI(0) to PI(3) are set to the D-type flip flops 301 to 304 synchronously with the clock signal (c).

If the serial signal (b) is set to "H" level, the transfer gates 315 to 317 are turned off and the transfer gates 311 to 314 are turned on. As a result thereof, the D-type flip flops 301 to 304 are connected in series to operate as a 4-bit shift register. Synchronously with the clock signal (c), data is sequentially shifted in the direction from the D-type flip flop 301 to 304 to be outputted at the serial output terminal SO.

Figure 2B:
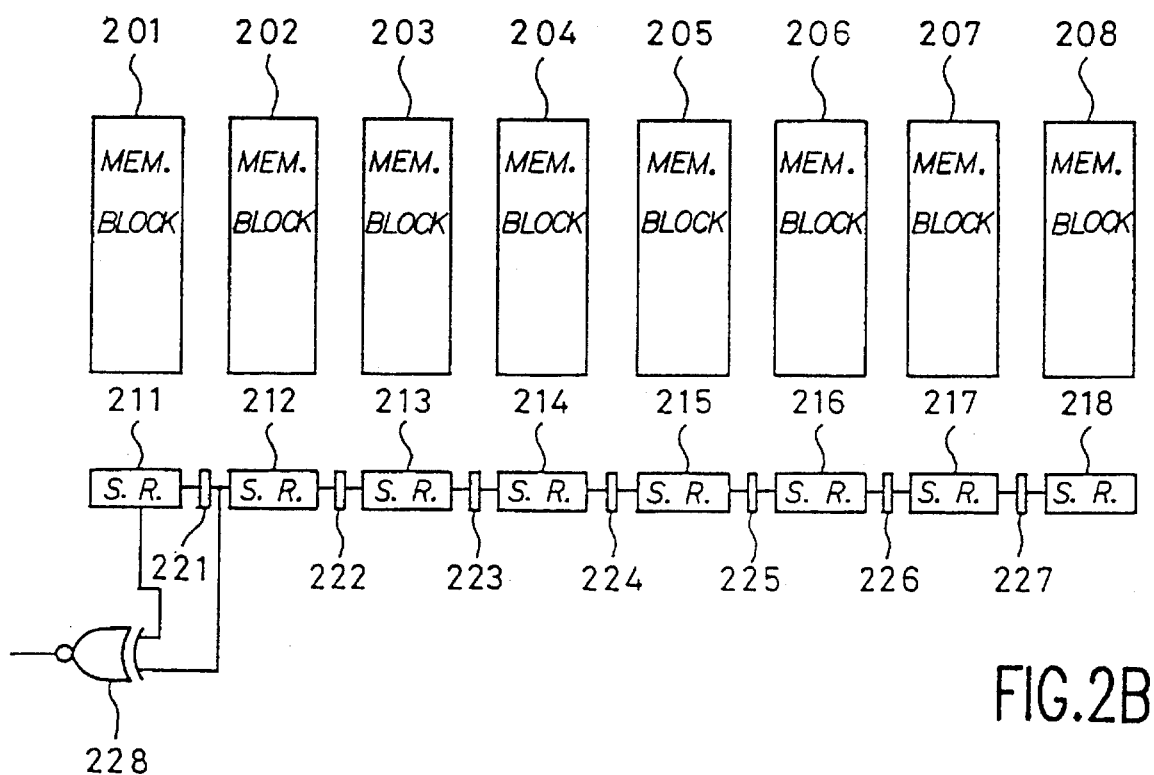
Figure 8A:
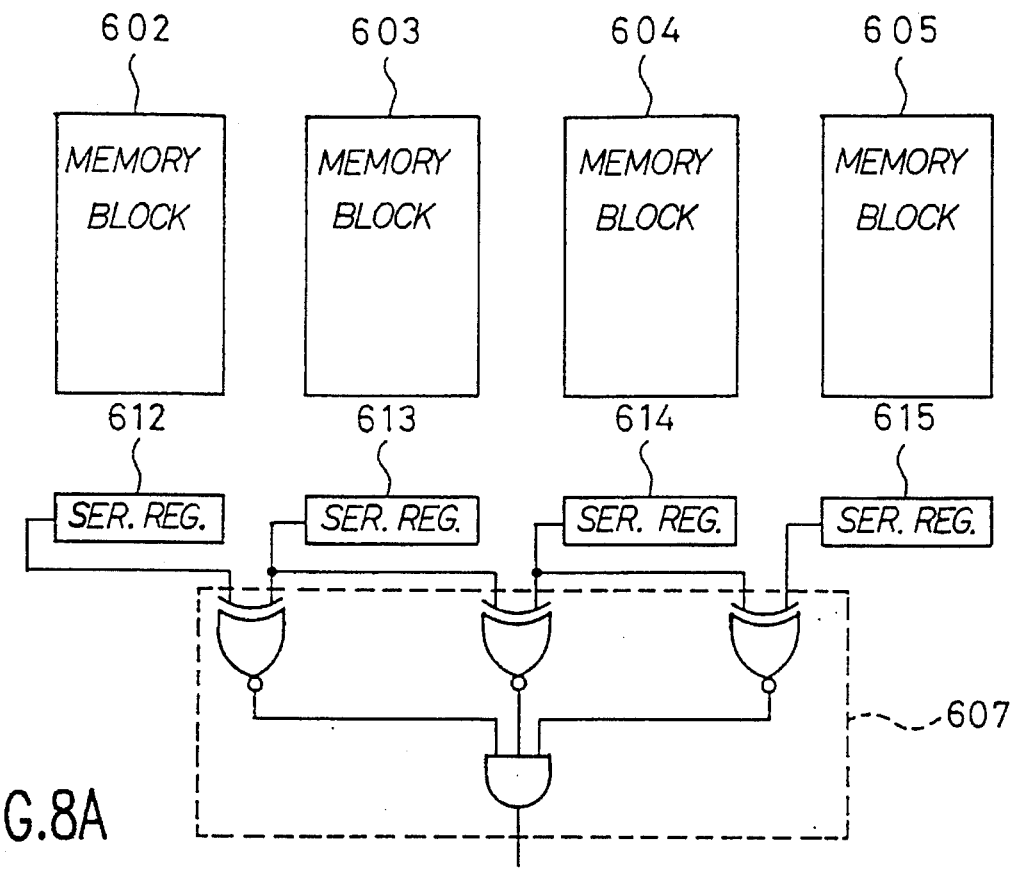
Figure 8B:
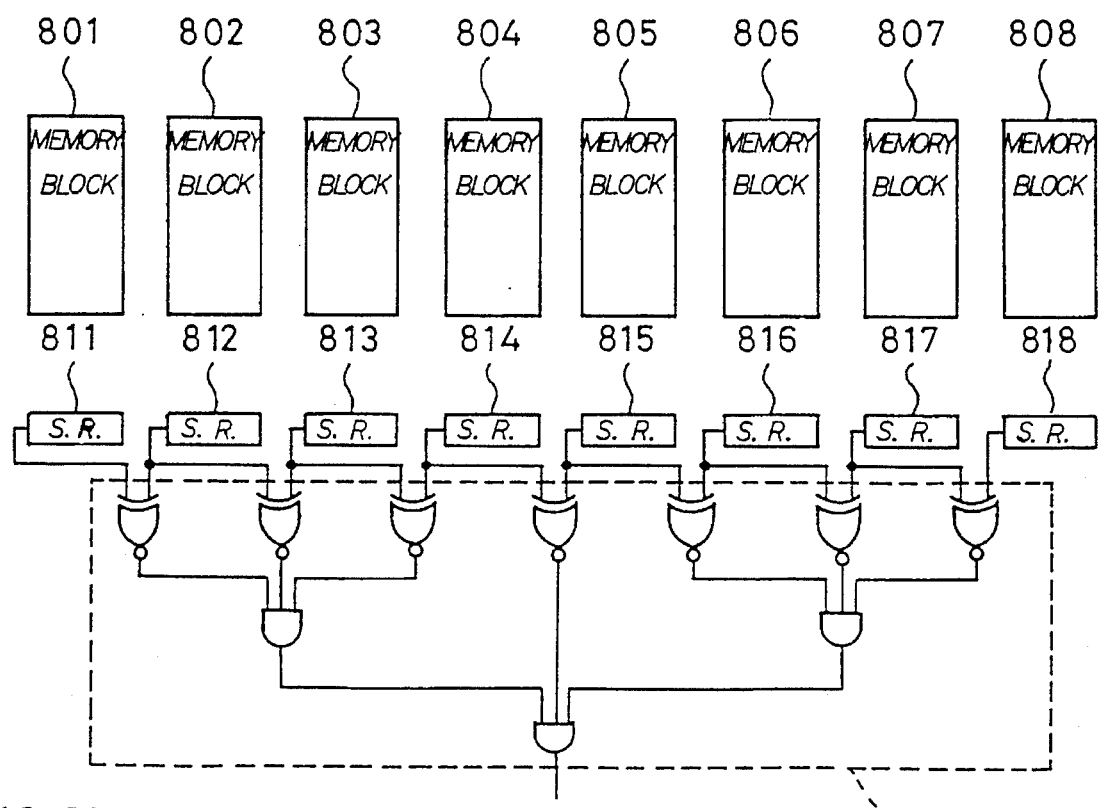

According to the present embodiment, as may be seen from FIG. 2, circuit elements to be added for coincidence detection are only four transfer gates even if the number of memory blocks and the number of serial registers increase from 4 (see FIG. 2(A) to FIG. 2(B)). FIG. 2(A) is a block diagram showing an arrangement of four memory blocks and four shift registers as a first exemplary configuration of the present embodiment while FIG. 2(B) is a block diagram showing an arrangement of eight memory blocks 201 to 208 and eight shift registers 211 to 218 as a second exemplary configuration of the present embodiment. The present embodiment significantly prevents the increase of the number of circuit elements required for coincidence detection due to the increase of the data width of a memory. Further, the present embodiment requires much less wires as may be easily understood by comparing the present embodiment shown in FIG. 2 and the prior art example shown in FIG. 8.

Figure 4:
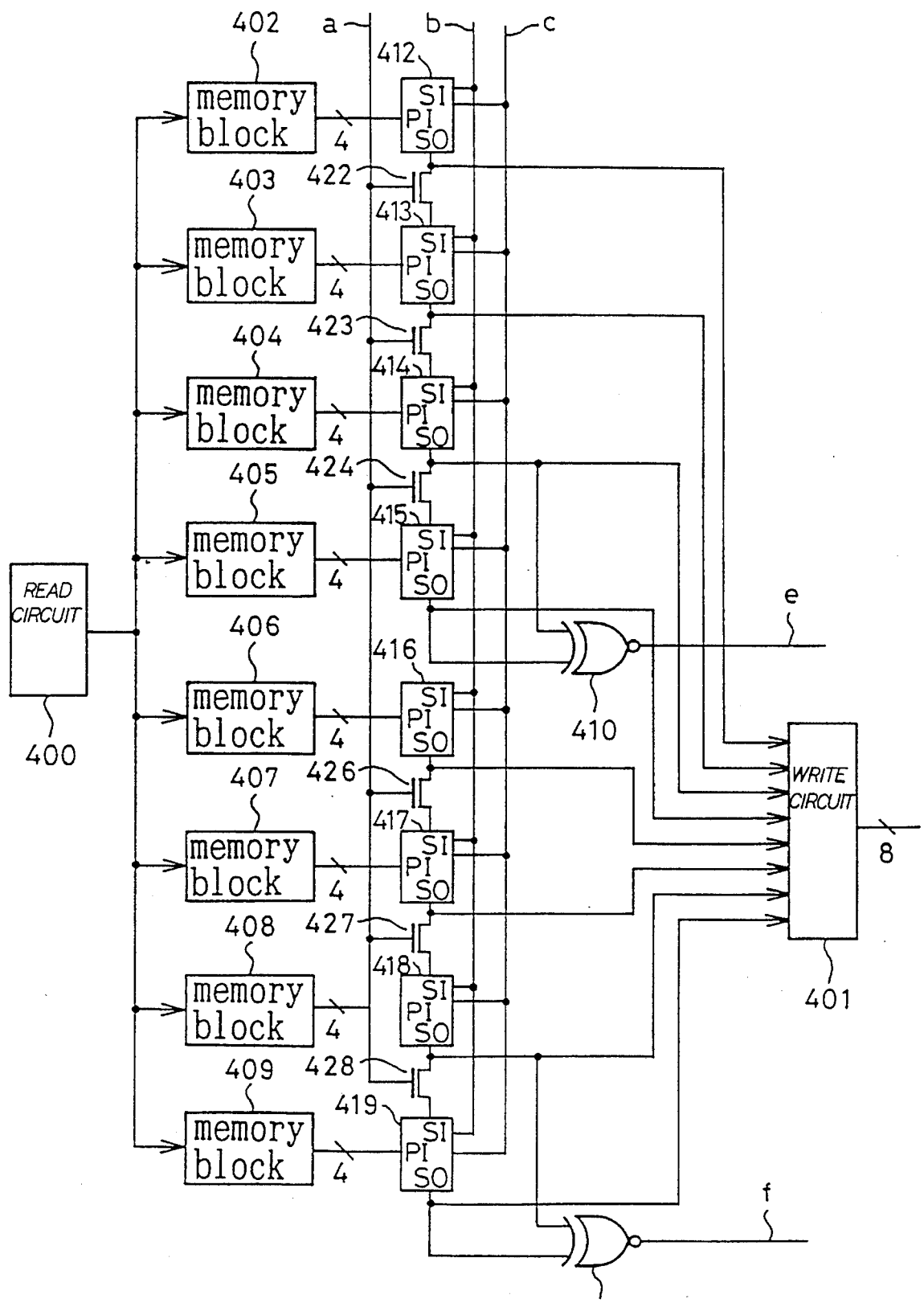
FIG. 4 is a block diagram showing the structure of the second embodiment of the present invention.
Figure 7A:
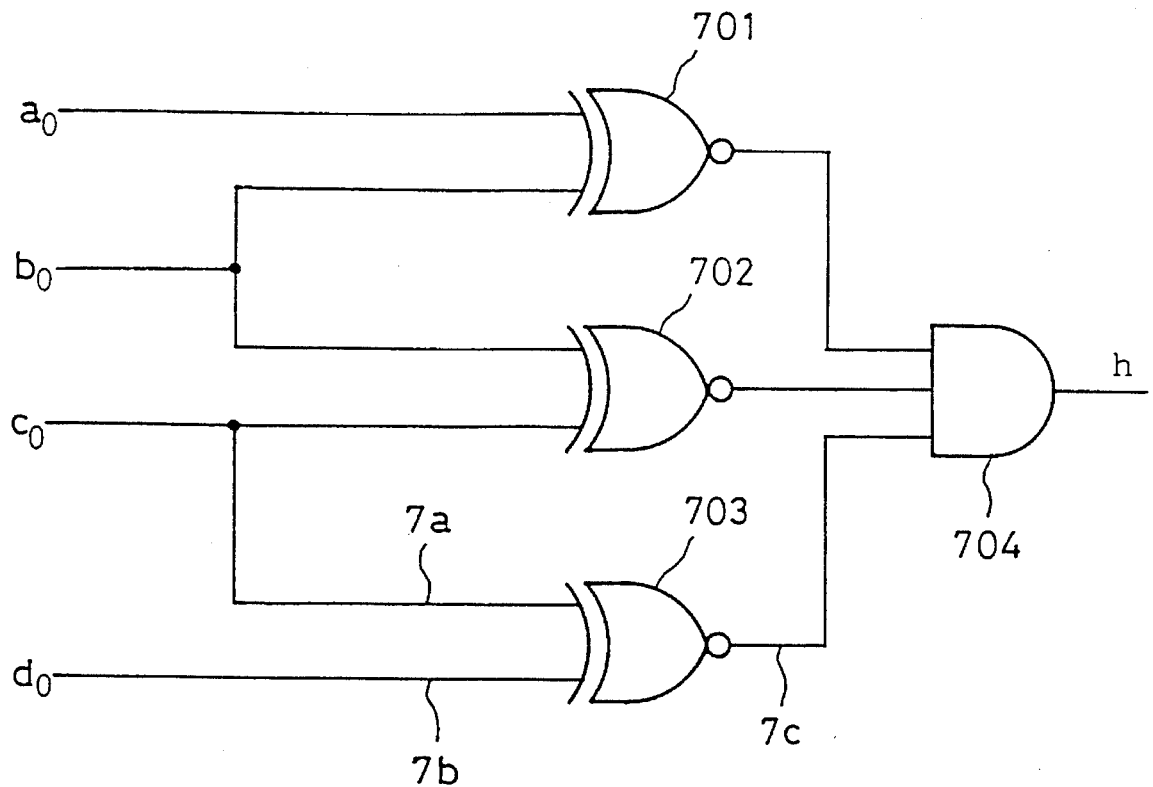
Figure 7B:
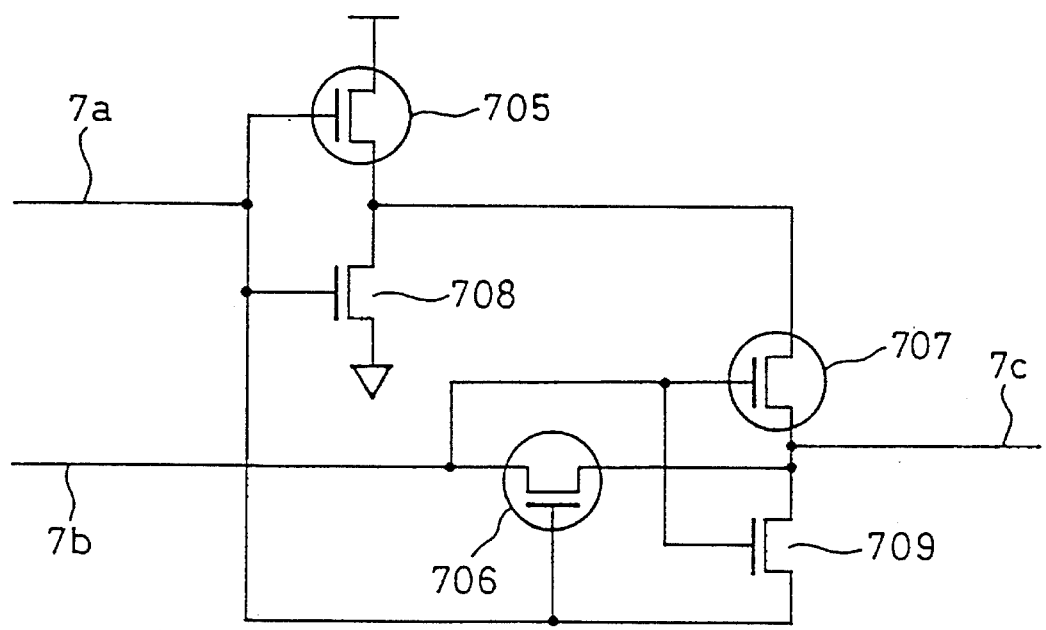

FIG. 4 is a block diagram showing the arrangement of the second embodiment of the present invention. As shown in FIG. 4, the semiconductor memory of the present embodiment comprises a write circuit 400, eight separate memory blocks 402 to 409, eight serial registers 412 to 419 each of which is connected to the outputs (4 bits) of the corresponding memory block in parallel respectively, transfer gates 422 to 424 each of which is provided between two adjacent ones of serial registers 412 to 415, transfer gates 426 to 429 each of which is provided between two adjacent ones of serial registers 416 to 419, a 2-input coincidence detection circuit 410 for checking a coincidence of an output data of the serial register 415 with that of the serial register 414, a 2-input coincidence detection circuit 412 for checking a coincidence of an output data of the serial register 419 with that of the serial register 418, and a read circuit 401.

With the first embodiment of the present invention, 12 clock cycles are required for comparing data in four serial registers connected with one another, and as the number of serial registers to be connected increases, the number of clocks required for data comparison increases.

With the present embodiment, plural serial registers 412 to 419 are divided into two groups and plural coincidence detection circuits 410 and 412 are arranged so that each of the coincidence detection circuits corresponds to a group of serial registers respectively, and serial registers belonging to a group are mutually connected for detecting a coincidence of data from serial registers in a group, instead of connecting all serial registers to form one serial register as in the first embodiment. With the present embodiment, even when the number of serial registers increases to eight, data comparison is finished with 12 clock cycles which is the the same as the number of clocks cycles required for comparing data in a four-serial-register-configuration as in the first embodiment, though the number of output signals of the coincidence detection circuits increases as compared to the first embodiment.

The above described preferred embodiments are illustrative and not restrictive, and the scope of the invention being indicated by the appended claims and all variations which come within the meaning of the claims are intended to be embraced therein.

For example, the present invention includes not only the semiconductor memory device described in the above embodiments having a serial register and a coincidence detection circuit in a chip but also a test device having the serial register and coincidence detection circuit as an exterior circuit.

What is claimed is:

1. A semiconductor memory device comprising:

a plurality of memory blocks;

a write circuit for writing data into said memory blocks;

a read circuit for reading data from said memory blocks;

a plurality of serial registers, each of said serial registers being connected to a corresponding memory block to output serially a plurality of data read from the memory block;

a plurality of switches, each of said switches being arranged between two adjacent ones of said serial registers to connect said serial registers in series; and coincidence detection means for detecting a coincidence of data outputted from a final serial register arranged at a final end of said serial registers connected by said switches with data outputted from a serial register arranged before said final serial register.

2. The semiconductor memory device as defined in claim 1 wherein each of said plurality of switches comprises an N-channel transfer gate.

3. The semiconductor memory device as defined in claim 1 wherein said coincidence detection means includes a 2-input exclusive NOR circuit.

4. The semiconductor memory device as defined in claim 1 wherein said plurality of serial registers include a plurality of D-type flip flops and a plurality of transfer gates respectively, each of said transfer gates being arranged between two adjacent D-type flip flops to connect the D-type flip flops in series in a test mode.

5. A semiconductor memory device comprising:

a plurality of memory blocks (= n blocks);

a plurality of n serial registers, each of said serial registers being connected to a corresponding memory block to output serially a plurality of data read from the memory block;

a plurality of switches for connecting said n serial registers by every m serial registers in series; and a plurality of coincidence detection circuits, wherein each of said coincidence detection circuits is arranged to detect a coincidence of data outputted from a final serial register of the m serial registers connected by the switches with data outputted from a serial register arranged immediately before the final serial register.

6. The semiconductor memory device as defined in claim 5 wherein said plurality of switches comprises an N-channel transfer gate.

7. The semiconductor memory device as defined in claim 5 wherein each of said coincidence detection circuits includes a 2-input exclusive NOR circuit.

8. The semiconductor memory device as defined in claim 5 wherein the serial register includes a plurality of D-type flip flops and a plurality of transfer gates, each of said transfer gates being arranged between two adjacent D-type flip flops to connect the D-type flip flops in series in a test mode.

9. A method for testing a semiconductor memory, wherein said semiconductor memory device comprises a plurality of memory blocks, a write circuit for writing data into said memory blocks, a read circuit for reading data from said memory blocks, a plurality of n serial registers, each of said n serial registers being connected to a corresponding memory block to output serially data read from the memory block, the method comprising steps of:

writing same data in said memory blocks at a test;

inputting data read from said memory blocks to said serial registers;

shifting the data in said n serial registers sequentially; and monitoring a result of a coincidence detection of data outputted from a final serial register arranged at a final end of said serial registers with a data outputted from a serial register arranged before the final serial register.

10. A method for testing a semiconductor memory, wherein said semiconductor memory device comprises a plurality of memory blocks, a plurality of serial registers, each of said serial registers being connected to a corresponding memory block to output serially data read from the memory block, said method comprising steps of:

writing same data in said memory blocks at a test;

inputting data read from said memory blocks to said serial registers;

dividing said n serial registers into a plurality of groups, each group comprising m serial registers to connect said m serial registers in every group; and monitoring by every group of said groups a result of a coincidence detection of data outputted from a final serial register arranged at a final end of said m serial registers with data outputted from a serial register arranged immediately before the final serial register.

* * * * *